United States Patent
Iizuka et al.

(10) Patent No.: US 7,772,092 B2
(45) Date of Patent: Aug. 10, 2010

(54) WAFER PROCESSING METHOD

(75) Inventors: Kentaro Iizuka, Tokyo (JP); Hirokazu Matsumoto, Tokyo (JP); Ryugo Oba, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 12/314,997

(22) Filed: Dec. 19, 2008

(65) Prior Publication Data

US 2009/0191692 A1     Jul. 30, 2009

(30) Foreign Application Priority Data

Jan. 25, 2008    (JP)   ............................. 2008-014539

(51) Int. Cl.
*H01L 21/268* (2006.01)
(52) U.S. Cl. ................. 438/463; 257/E21.347
(58) Field of Classification Search .................. 438/463
See application file for complete search history.

(56) References Cited

U.S. PATENT DOCUMENTS

| 7,572,657 | B2 * | 8/2009 | Yakushiji | ..................... 438/33 |
| 2005/0035100 | A1 * | 2/2005 | Genda | .................. 219/121.72 |
| 2008/0121906 | A1 * | 5/2008 | Yakushiji | ..................... 257/94 |

FOREIGN PATENT DOCUMENTS

| JP | 2005-142389 | 6/2005 |
| WO | WO2006/019180 | * 2/2006 |

* cited by examiner

*Primary Examiner*—Jarrett J Stark
*Assistant Examiner*—Lawrence Tynes, Jr.
(74) *Attorney, Agent, or Firm*—Smith, Gambrell & Russell, LLP (57) ABSTRACT

A method of processing a wafer having a plurality of devices which are composed of a laminate consisting of an insulating film and a functional film on the front surface of a substrate, along streets for sectioning the plurality of devices, the method comprising a first blocking groove forming step for forming a first blocking groove for dividing the laminate in a one-side portion in the width direction of a street of the wafer held on a chuck table by moving the chuck table in a first direction in the processing-feed direction while activating a first laser beam application means; and a second blocking groove and dividing groove forming step for forming a second blocking groove which divides the laminate in the other-side portion in the width direction of the street of the wafer which has undergone the first blocking groove forming step by moving the chuck table in a second direction in the processing-feed direction while activating the first laser beam application means and at the same time, forming a dividing groove in the laminate and the substrate along an intermediate portion between the first blocking groove and the second blocking groove formed in the street of the wafer by activating second laser beam application means.

2 Claims, 8 Drawing Sheets

WAFER PROCESSING METHOD

FIELD OF THE INVENTION

The present invention relates to a method of processing a wafer having a plurality of devices which are composed of a laminate consisting of an insulating film and a functional film on the front surface of a substrate, along streets for sectioning the plurality of devices.

DESCRIPTION OF THE PRIOR ART

As is known to people of ordinary skill in the art, a semiconductor wafer having a plurality of devices such as IC's or LSI's which are composed of a laminate consisting of an insulating film and a functional film and formed in a matrix state on the front surface of a substrate such as a silicon substrate is formed in the production process of a semiconductor device. The above devices of the semiconductor wafer formed as described above are sectioned by dividing lines called "streets", and the semiconductor wafer is divided along the streets to manufacture individual devices.

Dividing along the streets of the above semiconductor wafer is generally carried out by using a cutting machine called "dicer". This cutting machine comprises a chuck table for holding a semiconductor wafer as a workpiece, a cutting means for cutting the semiconductor wafer held on the chuck table, and a moving means for moving the chuck table and the cutting means relative to each other. The cutting means comprises a rotary spindle which is rotated at a high speed and a cutting blade mounted onto the spindle. The cutting blade is composed of a disk-like base and an annular cutting edge which is mounted onto the outer peripheral side wall of the base and formed by fixing diamond abrasive grains having a diameter of about 3 μm to the base by electroforming.

To improve the throughput of a device such as IC or LSI, a semiconductor wafer having a configuration that devices are composed of a laminate consisting of a low-dielectric constant insulating film (low-k film) made of a glass material such as $SiO_2$, SiO or SiN and a functional film for forming circuits on the front surface of a substrate such as a silicon substrate, has recently been implemented.

Since the above low-k film differs in material from the substrate, it is difficult to cut it together with the substrate by using the cutting blade. That is, as the low-k film is extremely fragile like mica, when the above semiconductor wafer is cut along the streets with the cutting blade, the low-k film peels off and consequently, a problem may occur that this peeling reaches the circuits and deals a fatal blow to the devices.

To solve the above problem, JP-A 2005-142389 discloses a wafer dividing method of cutting a semiconductor wafer along streets, comprising forming two grooves along the streets formed on the semiconductor wafer to divide the laminate, positioning the cutting blade between the outer sides of the two grooves, and moving the cutting blade and the semiconductor wafer relative to each other.

In the wafer dividing method disclosed by the above unexamined patent publication, the two grooves are formed along the streets formed on the semiconductor wafer by a laser beam processing machine and then, the portion between the outer sides of the two grooves is cut by a cutting machine. Therefore, there is a problem that the above method has low productivity.

SUMMARY OF THE INVENTION

It is an object of the present invention to provide a wafer processing method capable of efficiently processing a wafer having a plurality of devices which are composed of a laminate consisting of an insulating film and a functional film on the front surface of a substrate, along streets for sectioning the plurality of devices without damaging the devices.

To attain the above object, according to the present invention, there is provided a method of processing a wafer having a plurality of devices which are composed of a laminate consisting of an insulating film and a functional film on the front surface of a substrate, along streets for sectioning the plurality of devices by using a laser beam processing machine which comprises a chuck table for holding a workpiece, arranged in such a manner that it can move in a processing-feed direction, a first laser beam application means having a first condenser for applying a laser beam to the workpiece held on the chuck table, a second laser beam application means which has a second condenser for applying a laser beam to the workpiece held on the chuck table, which is spaced at a predetermined distance in the processing-feed direction from the first condenser, a processing-feed means for moving the chuck table in the processing-feed direction, an indexing-feed means for moving the chuck table in an indexing-feed direction perpendicular to the processing-feed direction, and a condenser position adjustment means for adjusting the relative positions in the indexing-feed direction of the first condenser and the second condenser, the method comprising:

a first blocking groove forming step for forming a first blocking groove in the laminate from one end toward the other end in a one-side portion in the width direction of a street of the wafer by positioning the one-side portion in the width direction at one end of the street of the wafer held on the chuck table at the application position of a laser beam to be applied from the first condenser of the first laser beam application means and activating the first laser beam application means to apply a laser beam having an output capable of dividing the laminate while moving the chuck table in a first direction in the processing-feed direction; and a second blocking groove and dividing groove forming step for forming a second blocking groove in the laminate from the other end toward one end in the other-side portion in the width direction of a street of the wafer by positioning the other-side portion in the width direction at the other end of the street which has undergone the first blocking groove forming step at the application position of a laser beam to be applied from the first condenser of the first laser beam application means and activating the first laser beam application means to apply a laser beam having an output capable of dividing the laminate while moving the chuck table in a second direction in the processing-feed direction and at the same time, forming a dividing groove in the laminate and the substrate from the other end toward one end along an intermediate portion between the first blocking groove and the second blocking groove formed in the street of the wafer by positioning the application position of a laser beam to be applied from the second condenser of the second laser beam application means at a position corresponding to the center portion in the width direction of the street which has undergone the first blocking groove forming step on a downstream side of a second direction in the processing-feed direction of the application position of a laser beam to be applied from the first condenser and activating the second laser beam application means to apply a laser beam having an output capable of forming the dividing groove in the laminate and the substrate.

According to the wafer processing method of the present invention, since the dividing groove forming step is carried out after the second blocking groove is formed and the laminate is divided in the second blocking groove and dividing groove forming step which is carried out after the first blocking groove forming step, if the laminate peels off, it does not affect the devices even when the dividing groove reaching the laminate and the substrate is formed with a laser beam having a high output as the both sides of the dividing groove are separated from the devices by the first blocking groove and the second blocking groove. In addition, as the first blocking groove forming step and the second blocking groove and dividing groove forming step are carried out during one round trip of the chuck table, the method of the present invention is efficient.

DETAILED DESCRIPTION OF THE PREFERRED EMBODIMENT

A preferred embodiment of the wafer processing method of the present invention will be described in detail hereinunder with reference to the accompanying drawings.

Figure 1:
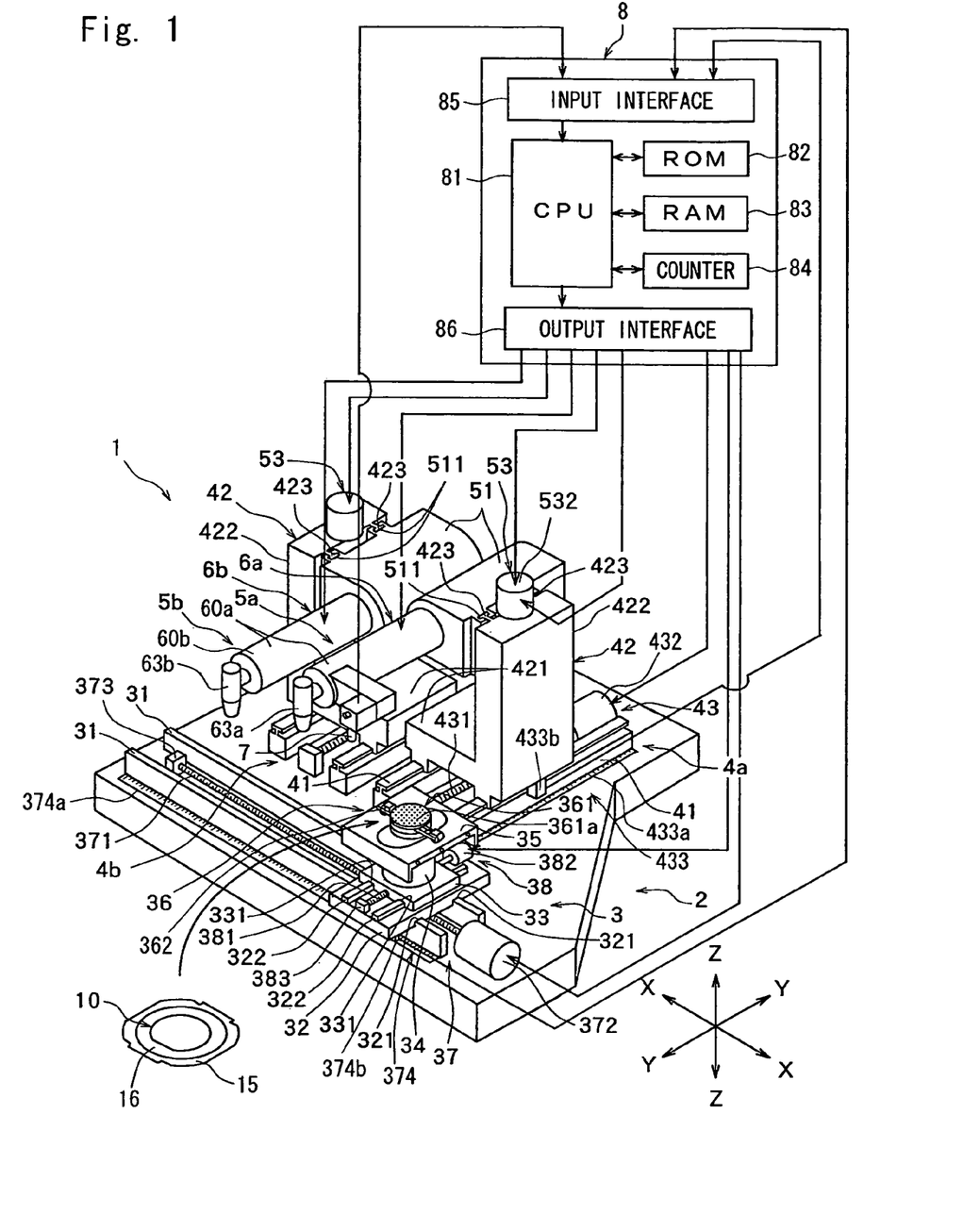
FIG. 1 is a perspective view of a laser beam processing machine for carrying out the wafer processing method of the present invention.

FIG. 1 is a perspective view of a laser beam processing machine for carrying out the wafer processing method of the present invention.

The laser beam processing machine 1 shown in FIG. 1 comprises a stationary base 2, a chuck table mechanism 3 for holding a workpiece, which is mounted on the stationary base 2 in such a manner that it can move in a processing-feed direction (X direction) indicated an arrow X, a first laser beam application unit support mechanism 4a mounted on the stationary base 2 in such a manner that it can move in an indexing-feed direction (Y direction) indicated by an arrow Y perpendicular to the processing-feed direction (X direction) indicated by the arrow X, a first laser beam application unit 5a mounted onto the first laser beam application unit support mechanism 4a in such a manner that it can move in a direction (Z direction) indicated by an arrow Z, a second laser beam application unit support mechanism 4b, and a second laser beam application unit 5b mounted onto the second laser beam application unit support mechanism 4b in such a manner that it can move in the direction (Z direction) indicated by the arrow Z.

The above chuck table mechanism 3 comprises a pair of guide rails 31 and 31 which are mounted on the stationary base 2 and arranged parallel to each other in the processing-feed direction (X direction) indicated by the arrow X, a first sliding block 32 mounted on the guide rails 31 and 31 in such a manner that it can move in the direction indicated by the arrow X, a second sliding block 33 mounted on the first sliding block 32 in such a manner that it can move in the indexing-feed direction (Y direction) indicated by the arrow Y, a support table 35 supported on the second sliding block 33 by a cylindrical member 34, and a chuck table 36 as a workpiece holding means. This chuck table 36 has an adsorption chuck 361 made of a porous material, and a wafer as a workpiece is held on the workpiece mounting surface 361a of the adsorption chuck 361 by a suction means that is not shown. The chuck table 36 is rotated by a pulse motor (not shown) installed in the cylindrical member 34.

The above first sliding block 32 has, on its undersurface, a pair of to-be-guided grooves 321 and 321 to be fitted to the above pair of guide rails 31 and 31 and, on the top surface, a pair of guide rails 322 and 322 formed parallel to each other in the indexing-feed direction (Y direction) indicated by the arrow Y. The first sliding block 32 constituted as described above is constituted to move along the pair of guide rails 31 and 31 in the processing-feed direction (X direction) indicated by the arrow X by fitting the to-be-guided grooves 321 and 321 to the pair of guide rails 31 and 31, respectively. The chuck table mechanism 3 in the illustrated embodiment comprises a processing-feed means 37 for moving the first sliding block 32 along the pair of guide rails 31 and 31 in the processing-feed direction (X direction) indicated by the arrow X. The processing-feed means 37 has a male screw rod 371 arranged between the above pair of guide rails 31 and 31 parallel to them and a drive source such as a pulse motor 372 for rotary-driving the male screw rod 371. The male screw rod 371 is, at its one end, rotatably supported to a bearing block 373 fixed on the above stationary base 2 and, at the other end, transmission-coupled to the output shaft of the above pulse motor 372. The male screw rod 371 is screwed into a threaded through-hole formed in a female screw block (not shown) projecting from the undersurface of the center portion of the first sliding block 32. Therefore, by driving the male screw rod 371 in a normal direction or reverse direction with the pulse motor 372, the first sliding block 32 is moved along the guide rails 31 and 31 in the processing-feed direction (X direction) indicated by the arrow X.

The laser beam processing machine 1 in the illustrated embodiment has an X-direction position detection means 374 for detecting the processing-feed position of the above chuck table 36. The X-direction position-detection means 374 comprises a linear scale 374a which is arranged along the guide rail 31 and a read head 374b which is mounted on the first sliding block 32 and moves along the linear scale 374a together with the first sliding block 32. The read head 374b of this X-direction position detection means 374 supplies one pulse signal for every 1 µm to a control means which will be described later in the illustrated embodiment. The control means described later counts the input pulse signals to detect the processing-feed position of the chuck table 36. When the pulse motor 372 is used as a drive source for the above processing-feed means 37, the processing-feed position of the chuck table 36 can be detected by counting the drive pulses of the later described control means for outputting a drive signal to the pulse motor 372. Further, when a servo motor is used as a drive source for the above processing-feed means 37, the processing-feed position of the chuck table 36 can be detected by counting pulse signals, which are outputted from a rotary encoder for detecting the revolution of the servo motor, sent once to the later described control means and then, get input from the control means.

The above second sliding block 33 has, on its undersurface, a pair of to-be-guided grooves 331 and 331 to be fitted to the pair of guide rails 322 and 322 on the top surface of the above first sliding block 32 and can move in the indexing-feed direction (Y direction) indicated by the arrow Y by fitting the to-be-guided grooves 331 and 331 to the pair of guide rails 322 and 322, respectively. The chuck table mechanism 3 in the illustrated embodiment comprises a first indexing-feed means 38 for moving the second sliding block 33 along the pair of guide rails 322 and 322 on the first sliding block 32 in the indexing-feed direction (Y direction) indicated by the arrow Y. The first indexing-feed means 38 comprises a male screw rod 381 which is arranged between the above pair of guide rails 322 and 322 parallel to them and a drive source such as a pulse motor 382 for rotary-driving the male screw rod 381. The male screw rod 381 is, at its one end, rotatably supported to a bearing block 383 fixed on the top surface of the above first sliding block 32 and is, at the other end, transmission-coupled to the output shaft of the above pulse motor 382. The male screw rod 381 is screwed into a threaded through-hole formed in a female screw block (not shown) projecting from the undersurface of the center portion of the second sliding block 33. Therefore, by driving the male screw rod 381 in a normal direction or reverse direction with the pulse motor 382, the second sliding block 33 is moved along the guide rails 322 and 322 in the indexing-feed direction (Y direction) indicated by the arrow Y.

The above first laser beam application unit support mechanism 4a comprises a pair of guide rails 41 and 41 mounted on the stationary base 2 and arranged parallel to each other in the indexing-feed direction (Y direction) indicated by the arrow Y and a movable support base 42 mounted on the guide rails 41 and 41 in such a manner that it can move in the indexing-feed direction (Y direction) indicated by the arrow Y. This movable support base 42 consists of a movable support portion 421 movably mounted on the guide rails 41 and 41 and a mounting portion 422 mounted on the movable support portion 421. The mounting portion 422 is provided with a pair of guide rails 423 and 423 extending parallel to each other in the direction (Z direction) indicated by the arrow Z, that is, the direction perpendicular to the workpiece placing surface 361a of the above chuck table 36 on one of its flanks. The first laser beam application unit support mechanism 4a in the illustrated embodiment comprises a second indexing-feed means 43 for moving the movable support base 42 along the pair of guide rails 41 and 41 in the indexing-feed direction (Y direction) indicated by the arrow Y. This second indexing-feed means 43 has a male screw rod 431 arranged between the above pair of guide rails 41 and 41 parallel to them and a drive source such as a pulse motor 432 for rotary-driving the male screw rod 431. The male screw rod 431 is, at its one end, rotatably supported to a bearing block (not shown) fixed on the above stationary base 2 and is, at the other end, transmission-coupled to the output shaft of the above pulse motor 432.

The male screw rod 431 is screwed into a threaded through-hole formed in a female screw block (not shown) projecting from the undersurface of the center portion of the movable support portion 421 constituting the movable support base 42. Therefore, by driving the male screw rod 431 in a normal direction or reverse direction with the pulse motor 432, the movable support base 42 is moved along the guide rails 41 and 41 in the indexing-feed direction (Y direction) indicated by the arrow Y. This second indexing-feed means 43 serves as a condenser position adjustment means for adjusting the relative positions in the indexing-feed direction (Y direction) of the first condenser 63a of a first laser beam application means 6a and the second condenser 63b of a second laser beam application means 6b which will be described later.

The laser beam processing machine 1 in the illustrated embodiment comprises a Y-direction position detection means 433 for detecting the index-feed position of the movable support base 42 of the above first laser beam application unit support mechanism 4a. This Y-direction position detection means 433 comprises a linear scale 433a which is arranged along the guide rail 41 and a read head 433b which is mounted on the movable support base 42 and moves along the linear scale 433a. The read head 433b of the Y-direction position detection means 433 supplies one pulse signal for every 1 μm to the later described control means in the illustrated embodiment. And, the later described control means counts the input pulse signals to detect the index-feed position (the position in the indexing-feed direction (Y direction) relative to the second laser beam application unit 5b which will be described later) of the first laser beam application unit 5a. When the pulse motor 432 is used as a drive source for the above second indexing-feed means 43, the index-feed position (the position in the indexing-feed direction (Y direction) relative to the second laser beam application unit 5b) of the first laser beam application unit 5a can be detected by counting the drive pulses of the later described control means for outputting a drive signal to the pulse motor 432. When a servo motor is used as a drive source for the above second indexing-feed means 43, the index-feed position (the position in the indexing-feed direction (Y direction) relative to the second laser beam application unit 5b) of the first laser beam application unit 5a can be detected by counting pulse signals, which are outputted from a rotary encoder for detecting the revolution of the servo motor, sent once to the later described control means and then, get input from the control means.

The first laser beam application unit 5a in the illustrated embodiment comprises a unit holder 51 and the first laser beam application means 6a attached to the unit holder 51. The unit holder 51 has a pair of to-be-guided grooves 511 and 511 to be slidably fitted to the pair of guide rails 423 and 423 on the above mounting portion 422 and is supported in such a manner that it can move in the direction (Z direction) indicated by the arrow Z by fitting the to-be-guided grooves 511 and 511 to the above guide rails 423 and 423, respectively. The first laser beam application unit 5a in the illustrated embodiment comprises a focal point position adjustment means 53 for moving the unit holder 51 along the pair of guide rails 423 and 423 in the direction (Z direction) indicated by the arrow Z. The focal point position adjustment means 53 has a male screw rod (not shown) arranged between the pair of guide rails 423 and 423 and a drive source such as a pulse motor 532 for rotary-driving the male screw rod. By driving the male screw rod (not shown) in a normal direction or reverse direction with the pulse motor 532, the unit holder 51 and the first laser beam application unit 5a are moved along the guide rails 423 and 423 in the direction (Z direction) indicated by the arrow Z.

Figure 2:
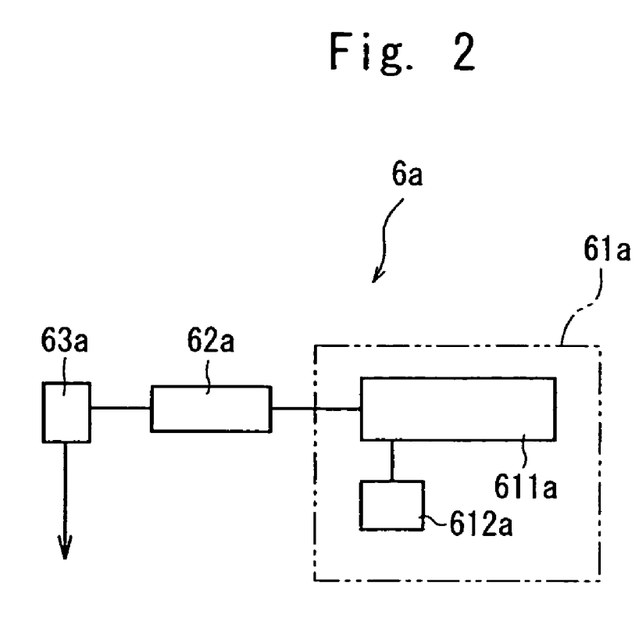
FIG. 2 is a block configuration diagram of a first laser beam application means provided in the laser beam processing machine shown in FIG. 1.

The first laser beam application means 6a comprises a cylindrical casing 60a secured to the above unit holder 51 and extending substantially horizontally. The first laser beam application means 6a further comprises a pulse laser beam oscillation means 61a and an output adjusting means 62a both of which are installed in the casing 60a and a first condenser 63a mounted onto the end of the above casing 60a as shown in FIG. 2. The above pulse laser beam oscillation means 61a is constituted by a pulse laser beam oscillator 611a composed of a YAG laser oscillator or YVO4 laser oscillator and a repetition frequency setting means 612a connected to the pulse laser beam oscillator 611a. The pulse laser beam oscillator 611a of this pulse laser beam oscillation means 61a oscillates a pulse laser beam having a wavelength of 355 nm. The output adjusting means 62a adjusts the output of a pulse laser beam oscillated from the pulse laser beam oscillation means 61a to a predetermined value.

An image pick-up means 7 is mounted onto the front end portion of the casing 60a constituting the above first laser beam application means 6a. This image pick-up means 7 is constituted by an infrared illuminating means for applying infrared radiation to the workpiece, an optical system for capturing infrared radiation applied by the infrared illuminating means, and an image pick-up device (infrared CCD) for outputting an electric signal corresponding to infrared radiation captured by the optical system, in addition to an ordinary image pick-up device (CCD) for picking up an image with visible radiation. An image signal is supplied to the control means later described.

A description will be subsequently given of the above second laser beam application unit support mechanism 4b and the second laser beam application unit 5b. As for the second laser beam application unit support mechanism 4b and the second laser beam application unit 5b, their constituent members having substantially the same functions as the constituent members of the above first laser beam application unit support mechanism 4a and the first laser beam application unit 5a are given the same reference symbols.

The second laser beam application unit support mechanism 4b is arranged parallel to the above first laser beam application unit support mechanism 4a, and the movable support base 42 of the second laser beam application unit support mechanism 4b is opposed to the movable support base 42 of the above first laser beam application unit support mechanism 4a. Therefore, the first laser beam application unit 5a mounted on the mounting portion 422 constituting the movable support base 42 of the above first laser beam application unit support mechanism 4a and the second laser beam application unit 5b mounted on the mounting portion 422 constituting the movable support base 42 of the second laser beam application unit support mechanism 4b are arranged line-symmetrical at positions close to each other. No image pick-up means is mounted on the front end portion of a casing 60b constituting the second laser beam application means 6b of the second laser beam application unit 5b.

Figure 3:
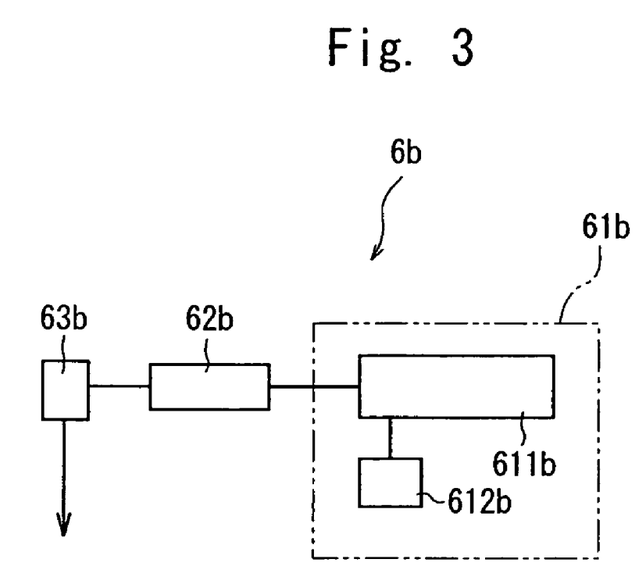
FIG. 3 is a block configuration diagram of a second laser beam application means provided in the laser beam processing machine shown in FIG. 1.

The second laser beam application means 6b comprises a cylindrical casing 60b secured to the unit holder 51 and extending substantially horizontally. The second laser beam application means 6b further comprises a pulse laser beam oscillation means 61b and an output adjusting means 62b both of which are installed in the casing 60b and a second condenser 63b mounted onto the end of the above casing 60b as shown in FIG. 3. The above pulse laser beam oscillation means 61b is constituted by a pulse laser beam oscillator 611b composed of a YVO4 laser oscillator and a repetition frequency setting means 612b connected to the pulse laser beam oscillator 611b. The pulse laser beam oscillator 611b of this pulse laser beam oscillation means 61b oscillates a pulse laser beam having a wavelength of 355 nm. The output adjusting means 62b adjusts the output of a pulse laser beam oscillated from the pulse laser beam oscillation means 61b to a predetermined value. The second condenser 63b of the second laser beam application means 6b and the first condenser 63a of the first laser beam application means 6a are arranged at a predetermined space in the processing-feed direction (X direction) from each other.

The laser beam processing machine 1 in the illustrated embodiment comprises a control means 8. The control means 8 is composed of a computer which comprises a central processing unit (CPU) 81 for carrying out arithmetic processing based on a control program, a read-only memory (ROM) 82 for storing the control program, etc., a read/write random access memory (RAM) 83 for storing the results of operations, a counter 84, an input interface 85 and an output interface 86. Detection signals from the above X-direction position detection means 374, the Y-direction position detection means 433 which serves as a condenser position adjustment means and the image pick-up means 7 are supplied to the input interface 85 of the control means 8. And, control signals are supplied to the above pulse motor 372, the pulse motor 382, the pulse motor 432, the pulse motor 532, the first laser beam application means 6a and the second laser beam application means 6b from the output interface 86 of the control means 8.

The laser beam processing machine 1 in the illustrated embodiment is constituted as described above, and the method of processing the wafer by using this laser beam processing machine 1 will be described hereinbelow.

Figure 4:
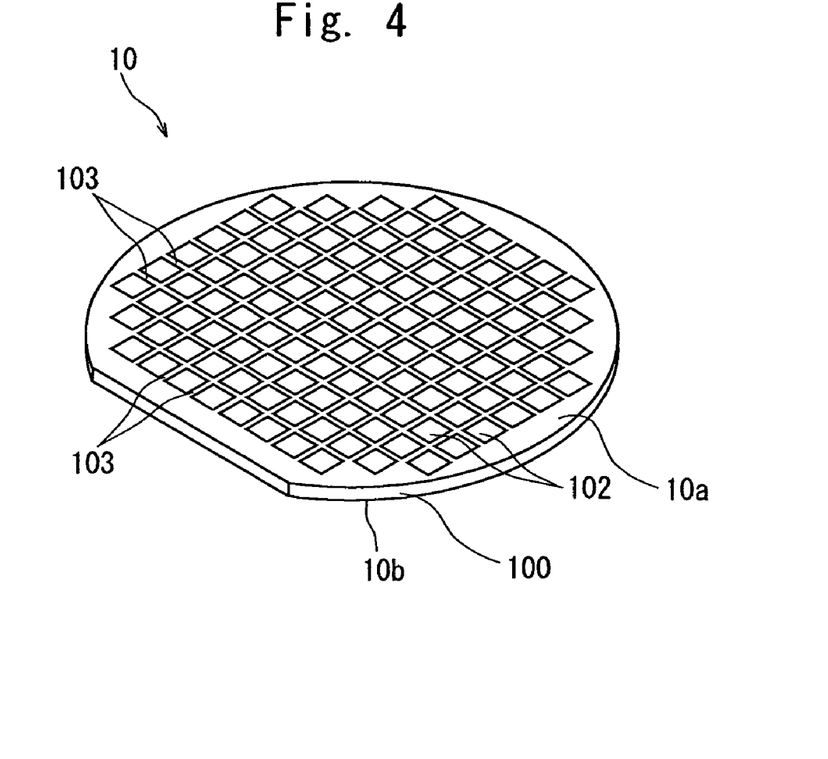
FIG. 4 is a perspective view of a semiconductor wafer as a wafer to be processed by the wafer processing method of the present invention.
Figure 5:
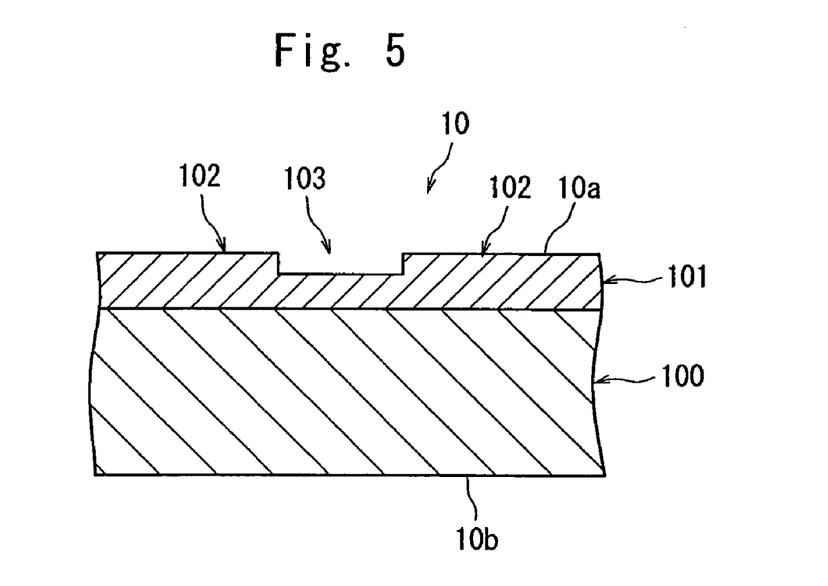
FIG. 5 is an enlarged sectional view of the key section of the semiconductor wafer shown in FIG. 4.

FIG. 4 is a perspective view of a semiconductor wafer as the wafer to be processed by the wafer processing method of the present invention, and FIG. 5 is an enlarged sectional view of the key section of the semiconductor wafer shown in FIG. 4. The semiconductor wafer 10 shown in FIG. 4 and FIG. 5 has a plurality of devices 102 such as IC's or LSI's which are composed of a laminate 101 consisting of an insulating film and a functional film for forming circuits and arranged in a matrix state on the front surface of a substrate 100 such as a silicon substrate. The devices 102 are sectioned by streets 103 formed in a lattice pattern. In the illustrated embodiment, the substrate 100 is made of Si or GaAs and has a thickness of, for example, 60 μm. The laminate 101 has a thickness of 2 to 10 μm, and the insulating film forming the laminate 101 is a low-dielectric constant insulating film (low-k film) made of a glass material such as $SiO_2$, SiO or SiN.

Figure 6:
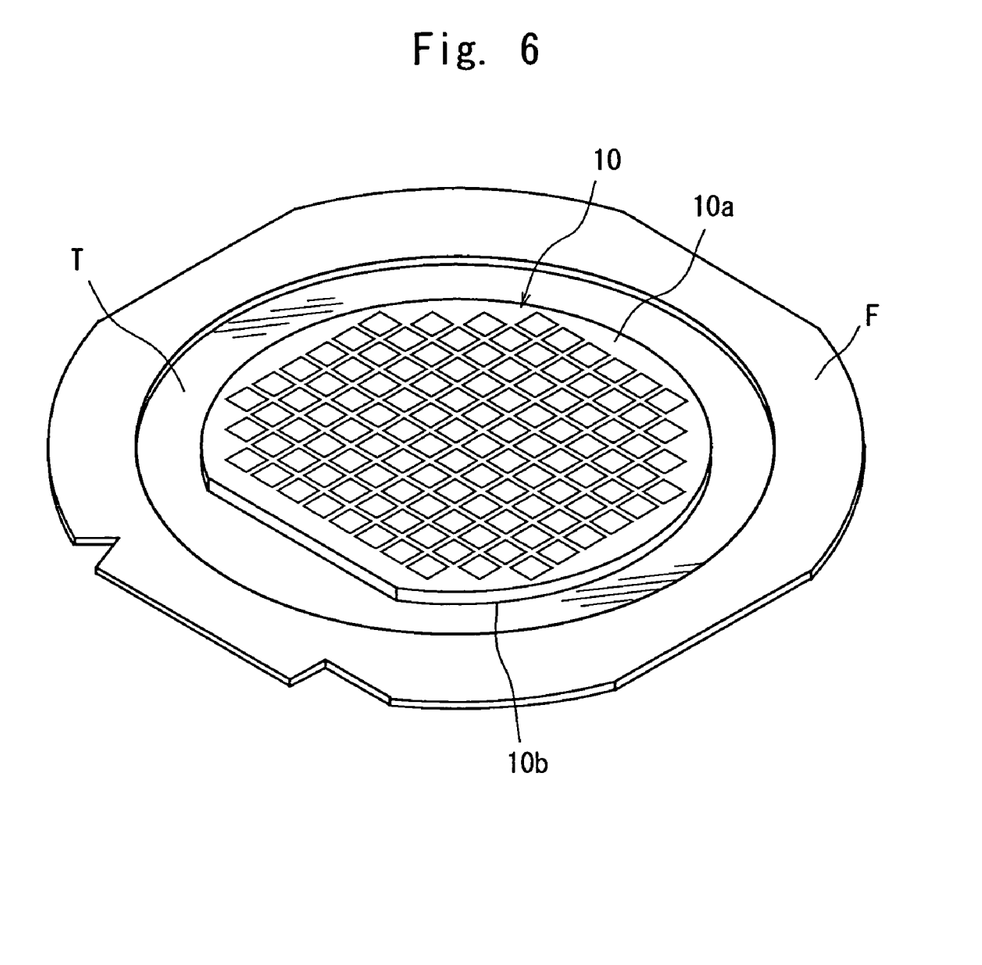
FIG. 6 is a perspective view showing a state of the semiconductor wafer shown in FIG. 4 being put on the front surface of a dicing tape mounted on an annular frame.

To carry out a laser-processing along the streets 103 of the above semiconductor wafer 10, the semiconductor wafer is put on the front surface of a dicing tape T which is a synthetic resin sheet such as a polyolefin sheet and mounted on an annular frame F, as shown in FIG. 6. At this point, the rear surface 10b of the semiconductor wafer 10 is put on the front surface of the dicing tape T. Therefore, the front surface 10a of the semiconductor wafer 10 is exposed.

The dicing tape T side of the semiconductor wafer 10 supported to the annular frame F through the dicing tape T is placed on the chuck table 36 of the laser beam processing machine 1 shown in FIG. 1. The semiconductor wafer 10 is then suction-held on the chuck table 36 through the dicing tape T by activating the suction means that is not shown. The annular frame F is fixed by clamps 362.

The chuck table 36 suction-holding the semiconductor wafer 10 as described above is brought to a position right below the image pick-up means 7 by the processing-feed means 37. After the chuck table 36 is positioned right below the image pick-up means 7, alignment work for detecting the area to be processed of the semiconductor wafer 10 is carried out by the image pick-up means 7 and the control means 8. That is, the image pick-up means 7 and the control means 8 carry out image processing such as pattern matching, etc. to align a street 103 formed in a predetermined direction of the semiconductor wafer 10 with the first condenser 63a of the first laser beam application means 6a for applying a laser beam along the street 103, thereby performing the alignment of a laser beam application position. The alignment of the laser beam application position is also carried out on streets 103 formed on the semiconductor wafer 10 in a direction perpendicular to the above predetermined direction.

Figure 7:
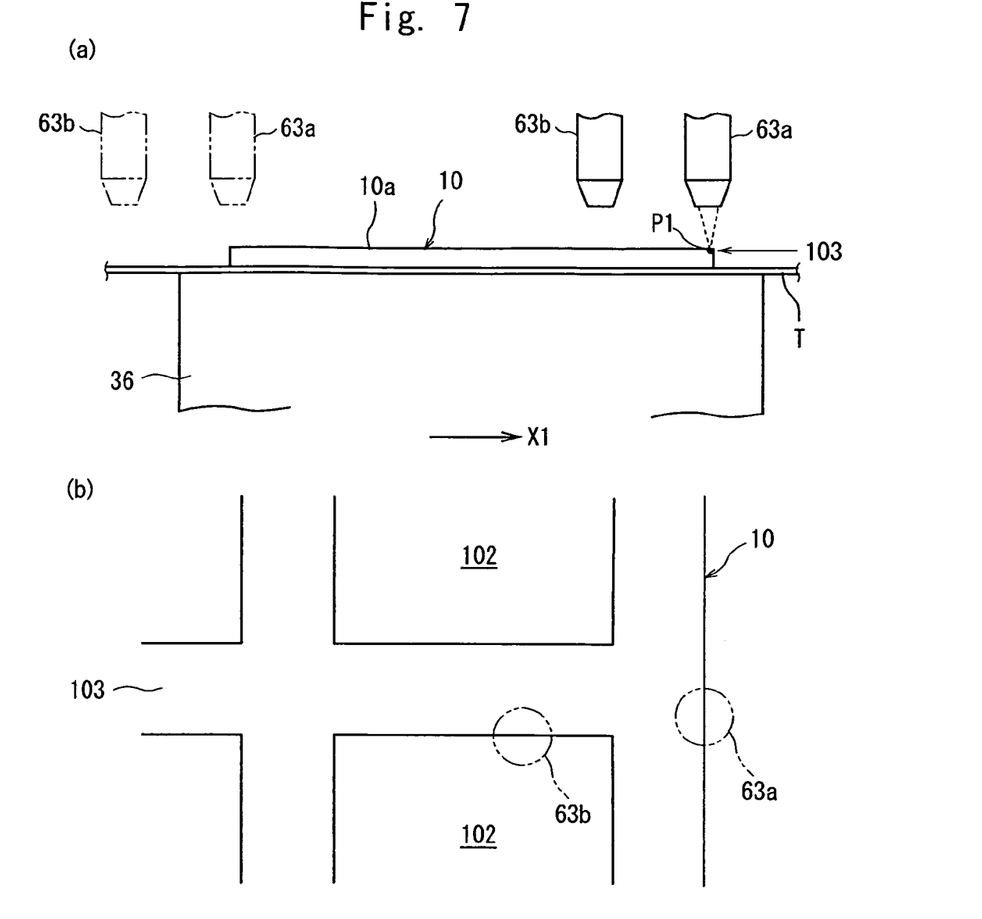
FIGS. 7(a) and 7(b) are explanatory diagrams showing a first blocking groove forming step in the wafer processing method of the present invention.
Figure 8:
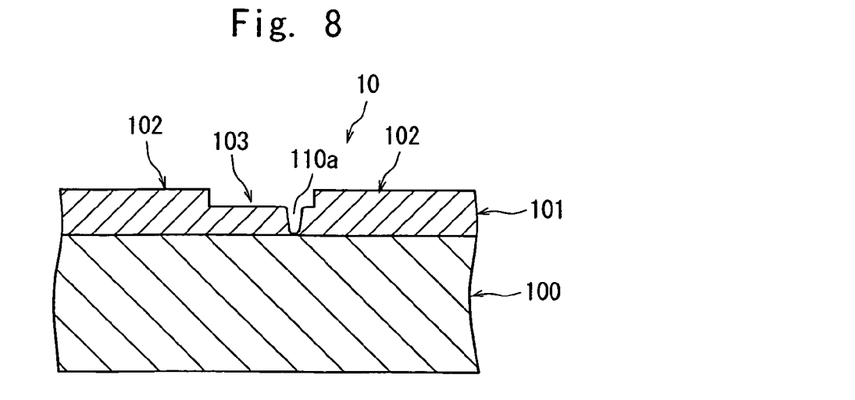
FIG. 8 is an enlarged sectional view of the key section of the semiconductor wafer which has undergone the first blocking groove forming step shown in FIGS. 7(a) and 7(b)

After the alignment of the laser beam application position is carried out by detecting the street 103 formed on the semiconductor wafer 10 held on the chuck table 36 as described above, next comes the step of forming a first blocking groove in the laminate 101 by applying a laser beam to a one-side portion in the width direction of the street 103 from one end toward the other end by activating the first laser beam application means 6a. That is, the control means 8 activates the processing-feed means 37 and the first indexing-feed means 38 to move the chuck table 36 to a laser beam application area where the first condenser 63a of the first laser beam application means 6a is located as shown in FIGS. 7(a) and 7(b) so as to bring the one-side portion (lower side in FIG. 7(b)) in the width direction of the street 103 at one end (right end in FIG. 7(a)) of the predetermined street 103 to a position right below the first condenser 63a of the first laser beam application means 6a (the position where a laser beam is applied from the first condenser 63a). And, the focal point P1 of a pulse laser beam applied from the first condenser 63a is set to a position close to the front surface 10a of the semiconductor wafer 10 by activating the focal point position adjustment means 53 of the first laser beam application means 6a. Thereafter, the control means 8 activates the pulse laser beam oscillation means 61a of the first laser beam application means 6a to apply a pulse laser beam having an output capable of dividing the laminate 101 from the first condenser 63a while activating the pulse motor 372 of the processing-feed means 37 to move the chuck table 36 in the direction indicated by the arrow X1 in FIG. 7(a) (a first direction in the processing-feed direction) at a predetermined feed rate (for example, 100 mm/sec). And, when the other end (left end in FIG. 7(a)) of the street 103 reaches a position right below the first condenser 63a of the first laser beam application means 6a, the operation of the first laser beam application means 6a is suspended and the movement of the chuck table 36 is stopped. As a result, a first blocking groove 110a is formed in the one-side portion (right side in FIG. 8) in the width direction of the street 103 in the laminate 101 of the semiconductor wafer 10 as shown in FIG. 8, and thus, the laminate 101 is separated.

The processing conditions in the above first blocking groove forming step are set as follows, for example.

Light source: YAG laser
Wavelength: pulse laser beam having a wavelength of 355 nm
Repetition frequency: 100 kHz
Average output: 1 W.

The above first blocking groove forming step is followed by the second blocking groove and dividing groove forming step of forming a second blocking groove in the laminate 101 by applying a laser beam to the other-side portion in the width direction of the street 103 which has undergone the first blocking groove forming step from the other end toward one end by activating the first laser beam application means 6a and simultaneously, forming a dividing groove in the laminate 101 and the substrate 100 by applying a laser beam along an intermediate portion between the first blocking groove and the second blocking groove formed in the street 103 from the other end toward one end by activating the second laser beam application means 6b. That is, the control means 8 activates the first indexing-feed means 38 after the end of the above first blocking groove forming step to move the chuck table 36 in the indexing-feed direction (direction perpendicular to the surface of the sheet in FIG. 7(a)) so as to bring the other-side portion (upper side in FIG. 9(b)) in the width direction of the street 103 at the other end (left end in FIG. 9(a)) of the street 103 which has undergone the above first blocking groove forming step to a position right below the first condenser 63a of the first laser beam application means 6a, as shown in FIGS. 9(a) and 9(b) (the position where a laser beam is applied from the first condenser 63a).

The positional relationship between the first condenser 63a of the first laser beam application means 6a and the second condenser 63b of the second laser beam application means 6b will be described with reference to FIG. 9(b). The second condenser 63b of the second laser beam application means 6b is located on the left side (on a downstream side in a second processing-feed direction X2) of the first condenser 63a of the first laser beam application means 6a at a predetermined interval L1 in the processing-feed direction (X direction) indicated by the arrow X. Further, the second condenser 63b of the second laser beam application means 6b is situated on the lower side in FIG. 9(b) of the first condenser 63a of the first laser beam application means 6a at a predetermined interval L2 in the indexing-feed direction (Y direction) indicated by the arrow Y. The interval L2 in the Y direction between the second condenser 63b of the second laser beam application means 6b and the first condenser 63a of the first laser beam application means 6a is set such that a position corresponding to the center in the width direction of the street 103 is located at a position right below the second condenser 63b of the second laser beam application means 6b (the application position of a laser beam to be applied from the second condenser 63b) when the other-side portion (upper side in FIG. 9(b)) in the width direction of the street 103 is positioned right below the first condenser 63a of the first laser beam application means 6a (the application position of a laser beam to be applied from the first condenser 63a). The adjustment of this interval L2 is carried out by activating the second indexing-feed means 43 which serves as the condenser position adjustment means for adjusting the relative positions in the indexing-feed direction (Y direction) of the first condenser 63a of the first laser beam application means 6a and the second condenser 63b of the second laser beam application means 6b to move the movable support base 42 along the guide rails 41 and 41 in the indexing-feed direction (Y direction) indicated by the arrow Y.

Figure 9:
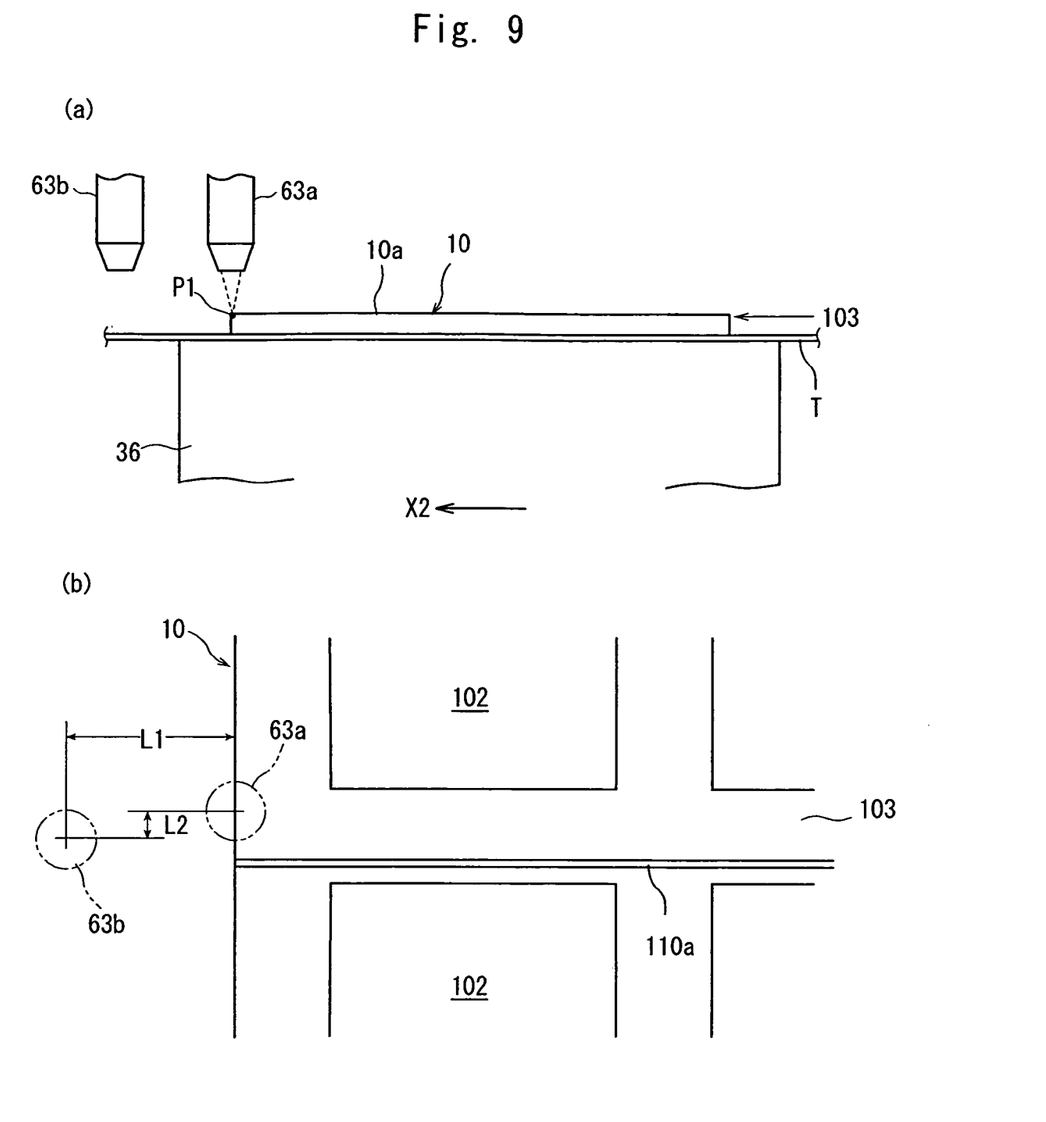
FIGS. 9(a) and 9(b) are explanatory diagrams showing a second blocking groove and dividing groove forming step in the wafer processing method of the present invention.
Figure 10:
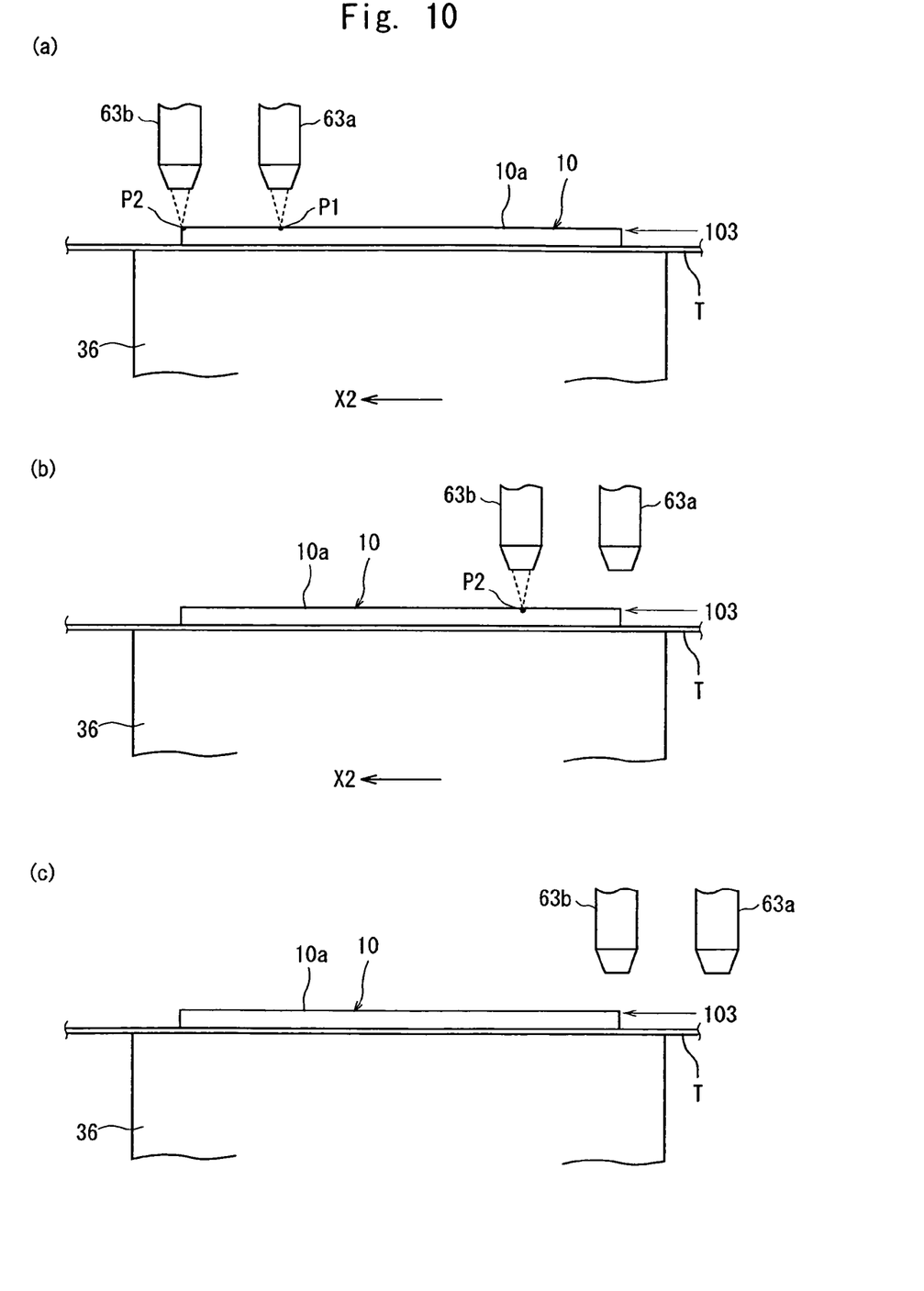
FIGS. 10(a), 10(b) and 10(c) are explanatory diagrams showing the second blocking groove and dividing groove forming step in the wafer processing method of the present invention.
Figure 11:
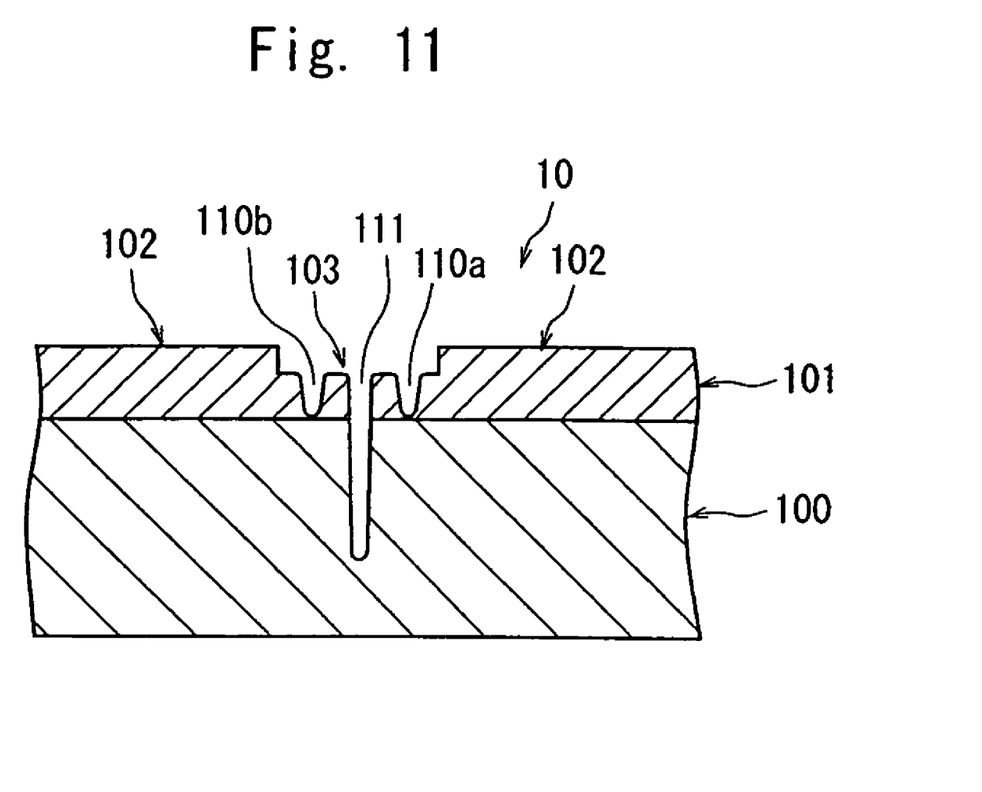
FIG. 11 is an enlarged sectional view of the key section of the semiconductor wafer which has undergone the second blocking groove and dividing groove forming step shown in FIGS. 9(a) and 9(b) and FIGS. 10(a), 10(b) and 10(c).

After the semiconductor wafer 10 held on the chuck table 36 is positioned as shown in FIGS. 9(a) and 9(b), the control means 8 activates the pulse laser beam oscillation means 61a of the first laser beam application means 6a to apply a pulse laser beam having an output capable of dividing the laminate 101 from the first condenser 63a while activating the pulse motor 372 of the processing-feed means 37 to move the chuck table 36 in the second processing-feed direction indicated by the arrow X2 in FIG. 9(a) at a predetermined feed rate (for example, 100 mm/sec). When the other end (left end in FIG. 10(a)) of the street 103 reaches a position right below the second condenser 63b of the second laser beam application means 6b as shown in FIG. 10(a), the second laser beam application means 6b is activated to apply a pulse laser beam having an output capable of forming a dividing groove in the laminate 101 and the substrate 100 of the semiconductor wafer 10 from the second condenser 63b. The focal point P2 of the pulse laser beam applied from the second condenser 63b of the second laser beam application means 6b is set to a position close to the front surface 10a of the semiconductor wafer 10 by the focal point position adjustment means 53 of the second laser beam application means 6b. And, when the other end (right end in FIG. 10(a)) of the street 103 reaches a position right below the first condenser 63a of the first laser beam application means 6a as shown in FIG. 10(b), the operation of the first laser beam application means 6a is suspended. When the chuck table 36 further moves in the second direction in the processing-feed direction indicated by the arrow X2 and the other end (right end in FIG. 10(a)) of the street 103 reaches a position right below the second condenser 63b of the second laser beam application means 6b as shown in FIG. 10(c), the operation of the second laser beam application means 6b is suspended and the movement of the chuck table 36 is stopped. As a result, a second blocking groove 10b is formed in the other-side portion (left side in FIG. 11) in the width direction of the street 103 in the laminate 101 of the semiconductor wafer 10 as shown in FIG. 11 to divide the laminate 101, and a dividing groove 111 reaching the laminate 101 and the substrate 100 is formed along the center portion in the width direction of the street 103, that is, in the intermediate portion between the first blocking groove 110a and the second blocking groove 110b.

The processing conditions in the second blocking groove forming step which is carried out by the first laser beam application means 6a in the above second blocking groove and dividing groove forming step may be the same as the processing conditions in the above first blocking groove forming step.

The processing conditions in the dividing groove forming step which is carried out by the second laser beam application means 6b in the above second blocking groove and dividing groove forming step are set as follows, for example.

Light source: YAG laser

Wavelength: pulse laser beam having a wavelength of 355 nm

Repetition frequency: 20 kHz

Average output: 10 W.

Since the dividing groove forming step is carried out after the second blocking groove 110b is formed to divide the laminate 101 in the second blocking groove and dividing groove forming step as described above, if the laminate 101 peels off, it does not affect the devices 102 even when the dividing groove 111 reaching the laminate 101 and the substrate 100 is formed with a laser beam having a high output, as the both sides of the dividing groove 111 formed in the laminate 101 are separated from the devices 102 by the first blocking groove 110a and the second blocking groove 110b. In addition, as the first blocking groove forming step and the second blocking groove and dividing groove forming step are carried out during one round trip of the chuck table 36, the method of the present invention is efficient.

After the above first blocking groove forming step and the second blocking groove and dividing groove forming step are carried out along all the streets 103 formed in the predetermined direction of the semiconductor wafer 10, the chuck table 36 is turned at 90° to turn the semiconductor wafer 10 held on the chuck table 36 at 90°. Then, the above first blocking groove forming step and the second blocking grove and dividing groove forming step are carried out along all the streets 103 formed on the semiconductor wafer 10 in the direction perpendicular to the above predetermined direction.

After the above first blocking groove forming step and the second blocking grove and dividing groove forming step are carried out along all the streets 103 formed on the semiconductor wafer 10, the semiconductor wafer 10 is carried to the subsequent dividing step.

What is claimed is:

1. A method of processing a wafer having a plurality of devices which are composed of a laminate consisting of an insulating film and a functional film on the front surface of a substrate, along streets for sectioning the plurality of devices by using a laser beam processing machine that comprises a chuck table for holding a workpiece, which is arranged in such a manner that it can move in a processing-feed direction, a first laser beam application means having a first condenser for applying a laser beam to the workpiece held on the chuck table, a second laser beam application means having a second condenser for applying a laser beam to the workpiece held on the chuck table, which is spaced at a predetermined distance in the processing-feed direction from the first condenser, a processing-feed means for moving the chuck table in the processing-feed direction, an indexing-feed means for moving the chuck table in an indexing-feed direction perpendicular to the processing-feed direction, and a condenser position adjustment means for adjusting the relative positions in the indexing-feed direction of the first condenser and the second condenser, the method comprising:

a first blocking groove forming step for forming a first blocking groove in the laminate from one end toward the other end in a one-side portion in the width direction of a street of the wafer by positioning the one-side portion in the width direction at one end of the street of the wafer held on the chuck table at the application position of a laser beam to be applied from the first condenser of the first laser beam application means and activating the first laser beam application means to apply a laser beam having an output capable of dividing the laminate while moving the chuck table in a first processing-feed direction; and a second blocking groove and a dividing groove forming step for forming a second blocking groove in the laminate from the other end toward the one end in the other-side portion in the width direction of the street of the wafer by positioning the other-side portion in the width direction at the other end of the street which has undergone the first blocking groove forming step at the application position of a laser beam to be applied from the first condenser of the first laser beam application means and activating the first laser beam application means to apply a laser beam having an output capable of dividing the laminate while moving the chuck table in a second processing-feed direction and at the same time, forming a dividing groove in the laminate and the substrate from the other end toward the one end along an intermediate portion between the first blocking groove and the second blocking groove formed in the street of the wafer by positioning the application position of a laser beam to be applied from the second condenser of the second laser beam application means at a position corresponding to the center portion in the width direction of the street which has undergone the first blocking groove forming step on a downstream side in the second processing-feed direction of the application position of a laser beam to be applied from the first condenser and activating the second laser beam application means to apply a laser beam having an output capable of forming the dividing groove in the laminate and the substrate.

2. A method of processing a wafer having a plurality of devices in a laminate of an insulating film and a functional film on a front surface of a substrate, and a plurality of streets sectioning the plurality of devices, the method comprising:

determining an intermediate portion that longitudinally divides a selected street to have a one-side portion and an opposite-side portion, in a width direction, on opposite sides of the intermediate portion;

positioning a first laser beam application means at one longitudinal end of the selected street, in the one-side portion of the selected street;

activating the first laser beam application means to apply a laser beam having an output that divides the laminate while relatively moving the first laser beam application means and a chuck table in a first processing-feed direction to form a first blocking groove that extends from the one longitudinal end to an opposite longitudinal end of the selected street;

after formation of the first blocking groove, positioning the first laser beam application means at the opposite longitudinal end of the selected street, in the other-side portion thereof; and activating the first laser beam application means to apply its laser beam having said output that divides the laminate to form a second blocking groove while relatively moving the first laser beam application means and the chuck table in a second processing-feed direction, opposite the first processing feed direction, to form a second blocking groove; and while the first laser beam application means is forming the second blocking groove, positioning a second laser beam application means above the intermediate portion at the opposite end of the selected street, and activating the second laser beam application means to apply a laser beam having an output that forms a dividing groove in the laminate and in the substrate.

* * * * *